United States Patent
Joo et al.

(10) Patent No.: US 8,546,789 B2
(45) Date of Patent: Oct. 1, 2013

(54) VOLATILE NEGATIVE DIFFERENTIAL RESISTANCE DEVICE USING METAL NANOPARTICLES

(75) Inventors: Won Jae Joo, Hwaseong-Si (KR); Kwang Hee Lee, Suwon-Si (KR); Sang Kyun Lee, Seongnam-Si (KR); Chulhee Kim, Incheon-Si (KR)

(73) Assignee: Samsung Electronics Co., Ltd. (KR)

(*) Notice: Subject to any disclaimer, the term of this patent is extended or adjusted under 35 U.S.C. 154(b) by 1184 days.

(21) Appl. No.: 11/452,838

(22) Filed: Jun. 14, 2006

(65) Prior Publication Data

US 2007/0080345 A1 Apr. 12, 2007

(30) Foreign Application Priority Data

Sep. 16, 2005 (KR) .................. 10-2005-0086779

(51) Int. Cl.
*H01L 29/08* (2006.01)
(52) U.S. Cl.
USPC ............................................. 257/40; 365/159
(58) Field of Classification Search
USPC ............ 257/40, E51.008–E51.011; 365/129, 365/151, 159
See application file for complete search history.

(56) References Cited

U.S. PATENT DOCUMENTS

| 3,719,933 | A | * | 3/1973 | Wakabayashi et al. | ........ 365/148 |
| 6,162,532 | A | * | 12/2000 | Black et al. | .................. 428/323 |
| 6,673,424 | B1 | | 1/2004 | Lindsay et al. | ............... 428/209 |
| 6,756,605 | B1 | | 6/2004 | Reed et al. | ...................... 257/40 |
| 6,950,331 | B2 | * | 9/2005 | Yang et al. | ..................... 365/148 |
| 7,309,875 | B2 | * | 12/2007 | Ohlberg | ........................... 257/40 |
| 7,405,167 | B2 | * | 7/2008 | Kang et al. | ..................... 438/780 |
| 2005/0040455 | A1 | * | 2/2005 | Bozano et al. | ................ 257/314 |
| 2005/0058009 | A1 | * | 3/2005 | Yang et al. | ..................... 365/232 |
| 2005/0116624 | A1 | * | 6/2005 | Shin | ............................... 313/504 |
| 2005/0247927 | A1 | * | 11/2005 | Campbell | ........................ 257/30 |
| 2005/0270442 | A1 | * | 12/2005 | Yang et al. | ..................... 349/86 |
| 2006/0131569 | A1 | * | 6/2006 | Choi et al. | ..................... 257/40 |
| 2006/0208248 | A1 | * | 9/2006 | Lee et al. | .......................... 257/3 |
| 2007/0164272 | A1 | * | 7/2007 | Yang et al. | ..................... 257/40 |

OTHER PUBLICATIONS

Bozano, L.D., et al. "Organic Materials and Thin-Film Structures for Cross-Point Memory Cells Based on Trapping in Metallic Nanoparticles." Adv. Funct. Mater., vol. 15 (2005): pp. 1933-1939.*
Ouyang, J., et al. "Organic Memory Device Fabricated Through Solution Processing." Proc. IEEE, vol. 93, No. 7 (Jul. 2005): pp. 1287-1296.*
Kang, S.H., et al. "Memory Effect from Charge Trapping in Layered Organic Structures." Appl. Phys. Lett., vol. 85, No. 20 (Nov. 15, 2004): pp. 4666-4668.*

* cited by examiner

*Primary Examiner* — Jenny L Wagner
*Assistant Examiner* — Mark Tornow
(74) *Attorney, Agent, or Firm* — Cantor Colburn LLP

(57) ABSTRACT

Disclosed herein is a volatile negative differential resistance device using metal nanoparticles, the device includes an organic layer disposed between two metal electrodes, in which the organic layer includes uniformly dispersed metal nanoparticles having a diameter of about 10 nm or less in an organic material. The device of this invention exhibits a volatile negative differential resistance phenomenon at room temperature upon application of a voltage and is thus suitable for use in various switching devices and logic devices, with excellent reproducibility and simple inexpensive processing.

33 Claims, 5 Drawing Sheets

Long alkyl chain
Metal nanoparticle 10 nm

VOLATILE NEGATIVE DIFFERENTIAL RESISTANCE DEVICE USING METAL NANOPARTICLES

This application claims priority to Korean Patent Application No. 2005-86779, filed on Sep. 16, 2005 and all the benefits accruing therefrom under 35 U.S.C. §119, and the contents of which in its entirety are herein incorporated by reference.

BACKGROUND OF THE INVENTION

1. Field of the Invention

The present invention relates, generally, to a volatile negative differential resistance device using metal nanoparticles, and more particularly, to a volatile negative differential resistance device having an organic layer disposed between two metal electrodes, in which the organic layer is formed by uniformly dispersing metal nanoparticles having a diameter of about 10 nm or less in an organic material, thus realizing a volatile negative differential resistance phenomenon at room temperature upon application of voltage.

2. Description of the Related Art

In general, a negative differential resistance ("NDR") device has been developed mainly using inorganic material. However, the NDR device using inorganic material is disadvantageous because it is manufactured through vacuum deposition requiring high temperature treatment, thus increasing manufacturing cost and complicating the manufacturing process. In particular, this NDR device is difficult to apply to flexible displays or flexible transistors, which have been thoroughly developed in recent years. Due to the drawbacks of the conventional inorganic NDR device, the development of NDR devices using organic material is receiving attention. NDR devices using organic material are capable of being manufactured through a simple wet process, such as spin coating at a low temperature.

The NDR device is classified as either a non-volatile NDR device or a volatile NDR device depending on whether recorded information is lost during an electrical power interruption. The volatile NDR device may be applied to various switching devices or logic devices such as mobile communication devices, delayed flip-flop circuits, etc., because of the volatile NDR properties thereof. However, almost all of the NDR devices using organic material developed to date exhibit a non-volatile NDR phenomenon. Thorough research into NDR devices exhibiting a volatile NDR phenomenon has not yet been conducted.

In this regard, U.S. Pat. No. 6,673,424 discloses a molecular electronic device, which includes gold nanoparticles and a self-assembled monolayer. However, the molecular electronic device does not teach the current-voltage properties of NDR.

In addition, U.S. Pat. No. 6,756,605 discloses a molecular scale electronic device, as a novel structure for improving volatile NDR. The molecular scale electronic device includes at least two conductive contacts and a monolayer of conductive organic material forming a conductive path between the contacts. However, this device suffers because it has a complicated manufacturing process, negates economical benefits and exhibits NDR only at a low temperature of about 60° K. Thus, because this device exhibits NDR only at about 60° K, it is difficult to actually use.

BRIEF SUMMARY OF THE INVENTION

Accordingly, the present invention has been contemplated keeping the above problems occurring in the related art in mind. An aspect of the present invention provides a volatile NDR device, which exhibits a volatile NDR phenomenon at room temperature, with excellent reproducibility and simple processability, by using metal nanoparticles, as material for an organic layer, and having a diameter controlled in a predetermined range to form a discrete energy state at room temperature.

In an exemplary embodiment of the present invention, a volatile NDR device comprises two metal electrodes and an organic layer disposed between the two metal electrodes. The organic layer is formed by uniformly dispersing metal nanoparticles having a diameter of about 10 nm or less in an organic material.

Other exemplary embodiments of the present invention include switching and logic devices each comprising an upper metal electrode; a lower metal electrode; an organic layer disposed between the two metal electrodes; and metal nanoparticles uniformly dispersed in the organic layer. The metal nanoparticles have a diameter of about 10 nm or less.

BRIEF DESCRIPTION OF THE DRAWINGS

The above and other aspects, features and advantages of the present invention will be more clearly understood from the following detailed description taken in conjunction with the accompanying drawings, in which.

DETAILED DESCRIPTION OF THE INVENTION

Figure 1:
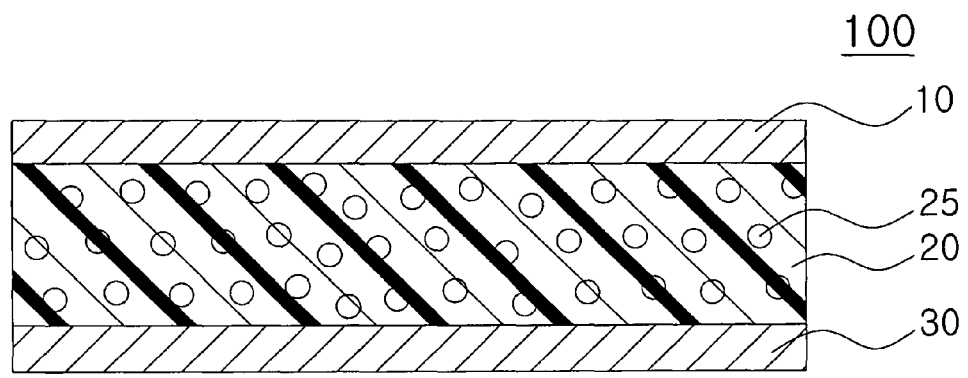
FIG. 1 is a schematic cross-sectional view showing a first exemplary embodiment of an NDR device, according to the present invention.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, the present invention will be described in detail with reference to the accompanying drawings.

FIG. 1 is a schematic cross-sectional view showing a first exemplary embodiment of an NDR device, according to the present invention. As shown in FIG. 1, the NDR device 100 of the present invention comprises an upper electrode 10, a lower electrode 30 and an organic layer 20 sandwiched between the upper electrode 10 and lower electrode 30. The organic layer 20 is a layer including metal nanoparticles 25 having a diameter of 10 nm or less uniformly dispersed in an organic material.

The device known as a resonant tunneling diode is structured such that a material having a discrete energy state is positioned between two metal electrodes and such that a tunneling barrier is present between each metal electrode and the material having a discrete energy state. When a high voltage is applied to such a device, the discrete energy state of the material positioned between the metal electrodes changes from a level higher than the work function of the metal electrode to a level lower than the work function thereof. When the discrete energy state of the material is higher than the work function of the metal electrode, electrical charges may be easily injected to enable current to flow. When the energy state is the same as the work function of the metal electrode, the current flow is the highest. In addition, upon application of higher voltage, the discrete energy state of the material lower than the work function of the metal electrode imposes limits on the injection of the electrical charges, thus decreasing the current flow. The decreased current flow means an increase in resistance. The portion of the device in which such a phenomenon is observed is called an "NDR region".

In this way, the NDR device, such as a resonant tunneling diode, should be manufactured such that the material positioned between the electrodes has a discrete energy state. Moreover, for the actual use of the device, the discrete energy state must be formed at room temperature. Since an energy band gap is increased by thermal energy (kT; k: Boltzman constant, T: absolute temperature) at room temperature, the NDR device is required to satisfy the following condition:

$$E_c = \frac{e^2}{2C} \gg k_B T$$

$$C_s = 4\pi\varepsilon_o r$$

where $E_c$ is a charging energy of a nanoparticle.

That is, the charging energy of the material positioned between the metal electrodes must be higher than the thermal energy upon application of a voltage. Accordingly, the NDR device 100 of the present invention satisfies the above condition by using metal nanoparticles 25 having a controlled diameter as material for the organic layer 20. Specifically, the NDR device 100 is characterized in that the diameter (r) of the metal nanoparticle 25 is controlled in a predetermined range so that the charging energy thereof is higher than the thermal energy when applying the voltage at room temperature and that the organic layer 20 in which such metal nanoparticles 25 are uniformly dispersed in the organic material is disposed between the electrodes 10 and 30 to form a discrete energy state, thus exhibiting a room temperature NDR phenomenon. In addition, since the NDR device 100 of the present invention can manifest volatile bistability by the applied voltage or current, it is applicable to various logic devices or switching devices.

The organic layer 20 of the NDR device 100, which is formed by uniformly dispersing the metal nanoparticles 25 having a predetermined diameter in the organic material, is designed on an appropriate substrate 5 (FIG. 2) formed of glass or silicon.

The metal nanoparticles 25 used in the present invention have a diameter of about 10 nm or less, and preferably between about 1 nm and about 5 nm. If the diameter of metal nanoparticle 25 exceeds 10 nm, the charging energy of the particle is equal to or smaller than the thermal energy (kT), and thus, it is impossible to form the discrete energy state.

Further, the metal nanoparticles 25 of the present invention may be coated with a certain organic material for surface stabilization. Specifically, an organic material represented by Formula 1 below is used to stabilize the surfaces of the metal nanoparticles 25, but is not limited thereto. Any material may be used without limit as long as it includes an —SH functional group, having high bondability to metal. For example, a macromolecule, having dendron and derivatives thereof as a repeating unit, may be used as the organic material.

　　　　　　　　　　　　　　　　Formula 1 wherein n is an integer from 3 to 19.

The metal nanoparticles 25 of the present invention may comprise nanoparticles of any metal selected from the group consisting of gold, silver, copper, iron, tungsten, platinum, aluminum, chromium, nickel, zinc, titanium and lead, but are not limited thereto.

The metal nanoparticles 25 of the present invention may be prepared using a typical process known in the art. Preferably, the metal nanoparticles 25 may be prepared by stabilizing the surfaces thereof with a certain organic material using a Brust-Schiffrin process.

The organic material constituting the organic layer 20 of the present invention is preferably a non-conductive polymer, which is exemplified by polymethylmethacrylate, polystyrene, PET, and derivatives thereof, but is not limited thereto.

The organic layer 20 may be formed by mixing the metal nanoparticles and the organic material constituting the organic layer 20 at a predetermined ratio and then subjecting the mixture to spin coating, thermal deposition, sputtering, ink-jetting or roll-to-roll coating. In this case, the mixing ratio of metal nanoparticles 25 and organic material constituting the organic layer 20 is appropriately controlled depending on the kind of metal or organic material. The solvents usable upon spin coating include, for example, acetone, cyclopentanone, cyclohexanone, methylethylketone, ethyl cellosolve acetate, butylacetate, ethylene glycol, toluene, xylene, chloroform, tetrahydrofuran, dimethylformamide, acetonitrile, or chlorobenzene. Among the above listed solvents, each solvent may be used alone or two or more solvents may be mixed at a predetermined ratio for use.

The organic layer 20 is preferably between about 10 nm and about 500 nm thick.

The upper electrode 10 and the lower electrode 30 are formed of any electrical conductive material selected from the group consisting of metals, metal alloys, metal nitrides, metal oxides, metal sulfides, and combinations thereof, but they are not limited thereto. Specifically, an exemplary material for the electrode includes gold, silver, iron, platinum, aluminum, titanium, tungsten, or indium tin oxide, but is not limited thereto.

The electrodes may be formed through a typical process, for example, deposition such as thermal deposition, sputtering, e-beam evaporation, spin coating, etc.

The upper electrode 10 and the lower electrode 30 may be formed either parallel to or perpendicular to a substrate. When the electrodes 10 and 30 are formed parallel to the substrate, the current flows parallel to the substrate. On the other hand, when the electrodes 10 and 30 are formed perpendicular to the substrate, the current flows perpendicular to the substrate.

Figure 2:
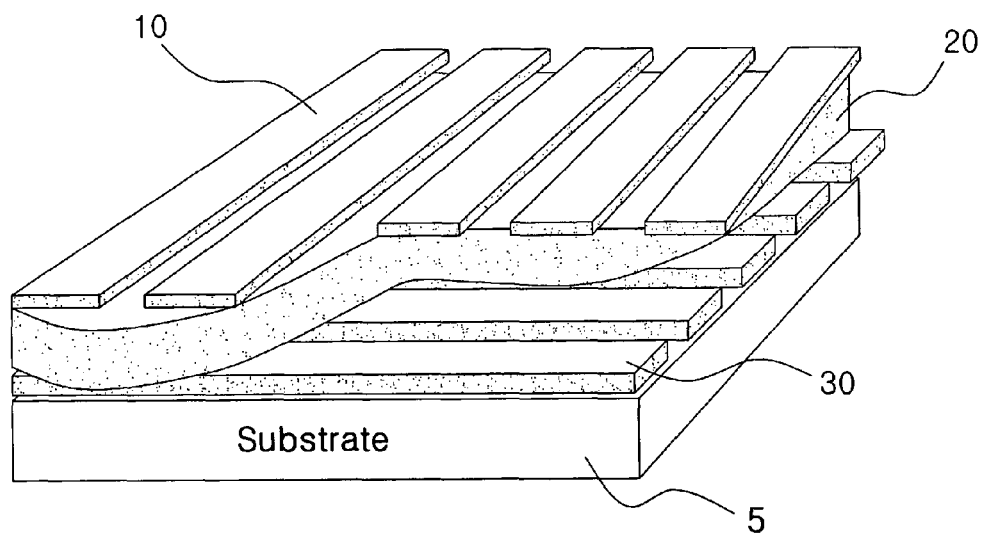
FIG. 2 is a perspective view showing an organic matrix of the present invention.

FIG. 2 illustrates an organic matrix according to the present invention. As shown in FIG. 2, the organic matrix is deposited on an appropriate substrate 5 formed of glass or silicon. The organic matrix includes an upper electrode 10, a lower electrode 30 and an organic layer 20 sandwiched between the upper and lower electrodes 10 and 30. The substrate 5 includes, for example, conventional organic or inorganic substrates. In particular, a soluble substrate may be used. The cells formed at the positions where the upper electrode 10 and the lower electrode 30 intersect each other provide bistable properties.

Figure 6:
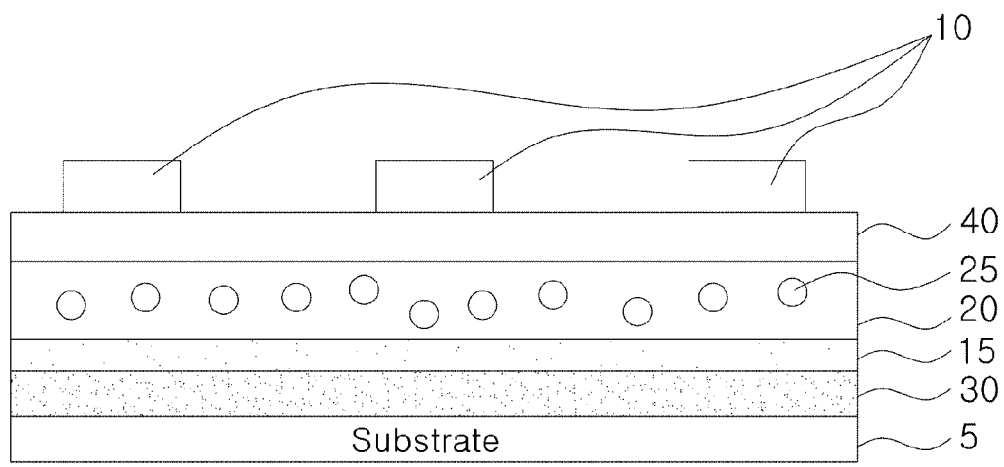
FIG. 6 is a schematic cross-sectional view showing a second exemplary embodiment of an NDR device, according to the present invention.

According to a second exemplary embodiment of the present invention, in order to control a barrier between the metal electrode 10 or 30 and the material having a discrete energy level, an NDR device further comprises a barrier layer, which is formed on a lower electrode 30 or beneath an upper electrode 10. FIG. 6 is a schematic cross-sectional view showing an NDR device including a barrier layer 40 beneath an upper electrode 10 and another barrier layer 15 on a lower electrode 30. As shown in FIG. 6, the barrier layer 15, an organic layer 20, the barrier layer 40 and the upper electrode 10 are sequentially formed on the lower electrode 30. The barrier layers 15 and 40 include an inorganic material selected from the group consisting of $SiO_x$, $AlO_x$, $NbO_x$, $TiO_x$, $CrO_x$, $VO_x$, $TaO_x$, $CuO_x$, $MgO_x$ and $AlNO_x$, or an organic material selected from the group consisting of Alq3, polymethylmethacrylate, polystyrene and PET. Preferably, the barrier layer includes any material selected from the group consisting of $SiO_2$, $Al_2O_3$, $Cu_2O$, $TiO_2$, BN, and $V_2O_3$.

Preferably, the barrier layers 15 and 40 are between about 2 nm and about 30 nm thick.

The NDR device of the present invention is advantageous because the metal nanoparticles 25 in the matrix can form a discrete energy state even at room temperature upon application of a voltage, thus exhibiting a volatile NDR phenomenon and bistable resistance values. Thus, the NDR device of the present invention may be applied to various switching devices or logic devices. As such, the logic device is exemplified by mobile communication devices, delayed flip-flop circuits, static binary frequency dividers and analog-to-digital converters, but is not limited thereto.

A better understanding of the present invention may be obtained in light of the following examples which are set forth to illustrate, but are not to be construed to limit, the present invention.

PREPARATIVE EXAMPLE

Preparation of Metal Nanoparticles

Figure 3:
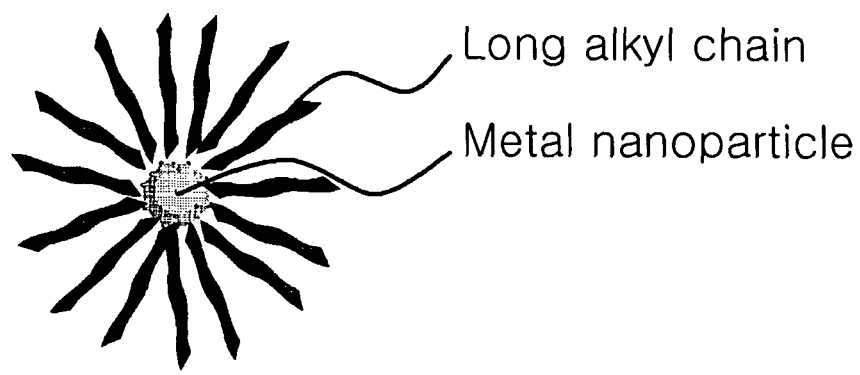
FIG. 3 is an enlarged view showing the structure of a metal nanoparticle used in the present invention.
Figure 4:
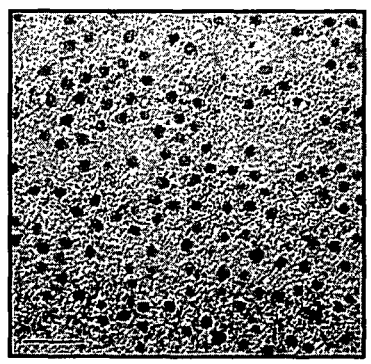
FIG. 4 is a transmission electron micrograph showing the metal nanoparticles used in the present invention.
Figure 5:
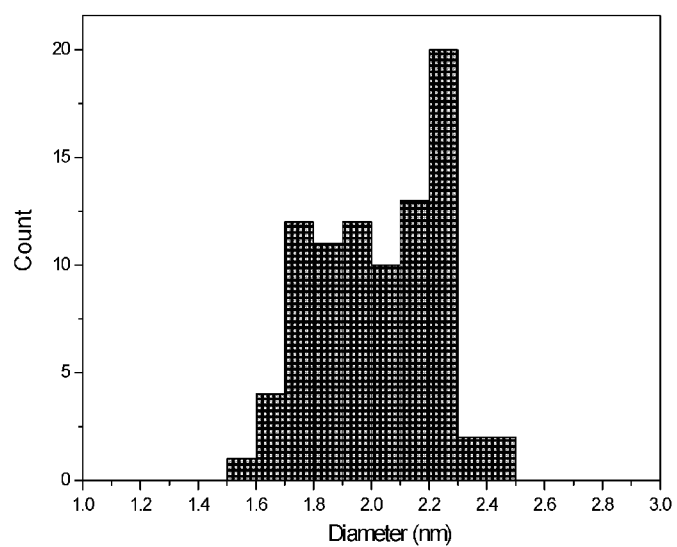
FIG. 5 is a graph showing an average diameter distribution of the metal nanoparticles used in the present invention.

In order to prepare gold nanoparticles (hereinafter, referred to as "$C_{11}$—S—Au") surface-stabilized with undecane thiol, tetraoctylammonium bromide was dissolved in a toluene solution, after which an aqueous $HAuCl_4$ solution was slowly added to the reaction mixture at $-10°$ C. Immediately after the reaction solution was added with undecane thiol and stirred for 10 minutes, an aqueous $NaBH_4$ solution was slowly added at $-10°$ C., resulting in a reduction reaction. Thus, when the solution turned a black-red color, $C_{11}$—S—Au began to be formed. The solution was further stirred for 3 hours, precipitated in ethanol, and sonicated and washed five times with ethanol, to remove unreacted undecane thiol and impurities, thereby separating $C_{11}$—S—Au nanoparticles. The structure of $C_{11}$—S—Au nanoparticles is shown in FIG. 3, and the transmission electron micrograph thereof is shown in FIG. 4. As the result of observing the diameter distribution of gold nanoparticles ($C_{11}$—S—Au) using a transmission electron microscope, the gold nanoparticles were confirmed to have an average diameter of 2 nm as seen in FIG. 5.

Example 1

On a glass substrate having a gold (Au) lower electrode deposited thereon, a solution of $C_{11}$—S—Au nanoparticles (1 wt %) obtained in the preparative example and polystyrene (3 wt %) dissolved in toluene was applied at 2500 rpm for 30 seconds through spin coating and then baked at 60° C. for 30 minutes. Thereafter, gold (Au) was deposited as an upper electrode, thus completing the device of the present invention. As such, the organic layer was 15 nm thick, and the electrode was 80 nm thick, the thickness of each layer being measured using an alpha-step profilometer. The upper electrode was deposited using thermal evaporation, and the thickness of the upper electrode to be deposited was controlled using a quartz crystal monitor.

Figure 7:
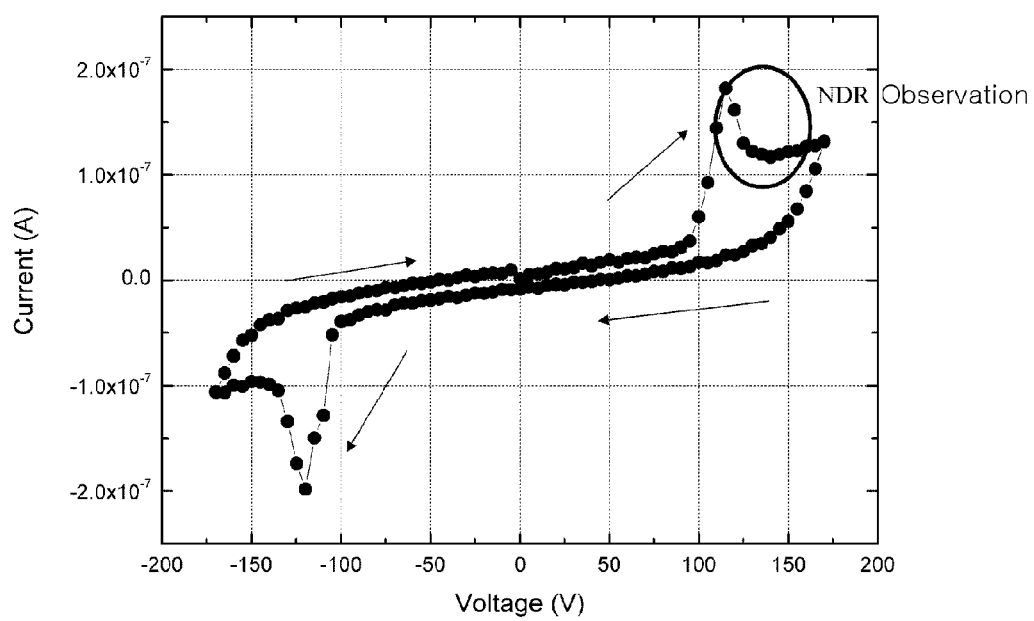
FIG. 7 is a graph showing current-voltage (I-V) properties of the NDR device manufactured in Example 1.

The current-voltage properties of the device thus manufactured were then measured. The results are shown in FIG. 7. In order to observe the electrical properties of the device, voltage was continuously applied at room temperature (300 K). At this time, positive voltage was applied up to 170 V, while negative voltage was applied up to −170 V. When the positive voltage was applied at the beginning, current was increased in proportion to the voltage from 0 V to 120 V. Then, the current was decreased in the range from 120 V to 130 V, in which an NDR phenomenon was observed. Thereafter, the current was increased again as the voltage was applied at 170 V. Upon decreasing the voltage to 0 V, no NDR phenomenon was observed on the current-voltage curve, as illustrated in FIG. 7. When the negative voltage was applied, an NDR phenomenon was observed in the range from −120 V to −140 V as in the application of the positive voltage. Upon application of the negative voltage, a Peak-to-Valley Ratio ("PVR") was about 2, which indicates a reproducible NDR phenomenon. From these results, the device of the present invention was confirmed to be applicable to various logic devices or switching devices by virtue of the volatile NDR phenomenon at room temperature and bistability, having two different resistance values at the same applied voltage.

Example 2

An NDR device was manufactured in the same manner as in Example 1, with the exception that aluminum (Al) was used as an upper electrode and a lower electrode.

Figure 8:
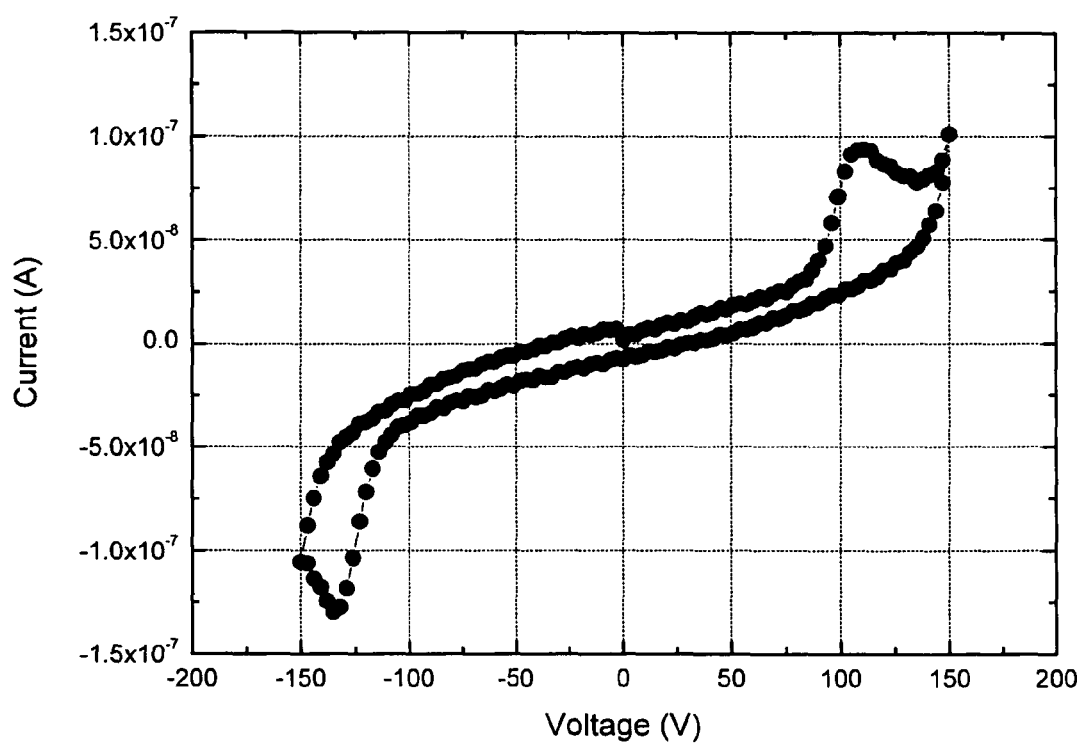
FIG. 8 is a graph showing current-voltage (I-V) properties of the NDR device manufactured in Example 2.

The current-voltage properties of the device thus manufactured were then measured. The results are given in FIG. 8. As is apparent from FIG. 8, although the device of the present invention had the PVR (1.2) lower than that of the device of Example 1, the device exhibited the volatile NDR phenomenon and bistable resistance values and thus could be usefully applied to various logic devices or switching devices.

As previously described herein, the present invention provides a volatile NDR device using metal nanoparticles. Since the NDR device of the present invention includes an organic layer, resulting from uniform dispersion of metal nanoparticles having a predetermined diameter in an organic material, it can exhibit a volatile NDR phenomenon at room temperature upon application of a voltage and is thus suitable for use in various switching devices and logic devices. Further, the inventive device has excellent reproducibility and is simple and inexpensive to manufacture.

Although the exemplary embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A volatile negative differential resistance device, comprising:
    an upper electrode;
    a lower electrode;
    an organic layer disposed between the upper and lower electrodes, the organic layer having a first side adjacent to the upper electrode and an opposite second side adjacent to the lower electrode, wherein the organic layer has a thickness of about 10 nanometers to about 50 nanometers, wherein the organic layer comprises a non-conductive polymer;
    a barrier layer directly on at least one of the first and second sides of the organic layer; and
    metal nanoparticles uniformly dispersed in the organic layer, the metal nanoparticles having a diameter of about 10 nm or less, and the metal nanoparticles having an organic material represented by the following formula on a surface of the metal nanoparticles:

wherein n is an integer from 3 to 10 or 12 to 19.

2. The device as set forth in claim 1, wherein the metal nanoparticle is surface-stabilized with an organic material represented by Formula 1 below:

  Formula 1 wherein n is an integer from 3 to 10 or 12 to 19.

3. The device as set forth in claim 1, wherein the metal nanoparticles are nanoparticles of any metal selected from the group consisting of gold, silver, copper, iron, tungsten, platinum, aluminum, chromium, nickel, zinc, titanium and lead.

4. The device as set forth in claim 1, wherein the non-conductive polymer is selected from the group consisting of polymethylmethacrylate, polystyrene, PET and derivatives thereof.

5. The device as set forth in claim 1, wherein the organic layer is about 15 nm thick.

6. The device as set forth in claim 1, wherein the organic layer is formed by subjecting an organic material having metal nanoparticles dispersed therein to spin coating, thermal deposition, sputtering, ink-jetting or roll-to-roll coating.

7. The device as set forth in claim 1, wherein each of the upper and lower electrodes is formed of any material selected from the group consisting of metals, metal alloys, metal nitrides, metal oxides, metal sulfides and mixtures thereof.

8. The device as set forth in claim 7, wherein each of the upper and lower electrodes is formed of any material selected from the group consisting of gold, silver, iron, platinum, aluminum, titanium, tungsten and indium tin oxide.

9. The device as set forth in claim 1, wherein the lower electrode is on a substrate and the upper electrode and the lower electrode are either parallel to or perpendicular to the substrate.

10. The device as set forth in claim 1, wherein the barrier layer includes a first barrier layer and a second barrier layer, and wherein the first barrier layer is beneath the upper electrode and the second barrier layer is on the lower electrode.

11. The device as set forth in claim 1, wherein the barrier layer is between about 2 nm and about 30 nm thick.

12. A switching device comprising:
    an upper electrode;
    a lower electrode;
    an organic layer disposed between the upper and lower electrodes, the organic layer having a first side adjacent to the upper electrode and an opposite second side adjacent to the lower electrode, wherein the organic layer has a thickness of about 10 nanometers to about 50 nanometers, wherein the organic layer comprises a non-conductive polymer;
    a barrier layer directly on at least one of the first and second sides of the organic layer; and
    metal nanoparticles uniformly dispersed in the organic layer, the metal nanoparticles having a diameter of about 10 nm or less, and the metal nanoparticles having an organic material represented by the following formula on a surface of the metal nanoparticles:

wherein n is an integer from 3 to 10 or 12 to 19.

13. The device as set forth in claim 12, wherein the metal nanoparticle is surface-stabilized with an organic material represented by Formula 1 below:

$$CH_3(CH_2)_nSH \quad \text{Formula 1}$$

wherein n is an integer from 3 to 10 or 12 to 19.

14. The device as set forth in claim 12, wherein the metal nanoparticles are nanoparticles of any metal selected from the group consisting of gold, silver, copper, iron, tungsten, platinum, aluminum, chromium, nickel, zinc, titanium and lead.

15. The device as set forth in claim 12, wherein the non-conductive polymer is selected from the group consisting of polymethylmethacrylate, polystyrene, PET and derivatives thereof.

16. The device as set forth in claim 12, wherein the organic layer is about 15 nm thick.

17. The device as set forth in claim 16, wherein the organic layer is formed by subjecting an organic material having metal nanoparticles dispersed therein to spin coating, thermal deposition, sputtering, ink-jetting or roll-to-roll coating.

18. The device as set forth in claim 12, wherein each of the upper and lower electrodes is formed of any material selected from the group consisting of metals, metal alloys, metal nitrides, metal oxides, metal sulfides and mixtures thereof.

19. The device as set forth in claim 18, wherein each of the upper and lower electrodes is formed of any material selected from the group consisting of gold, silver, iron, platinum, aluminum, titanium, tungsten and indium tin oxide.

20. The device as set forth in claim 12, wherein the lower electrode is on a substrate and the upper electrode and the lower electrode are either parallel to or perpendicular to the substrate.

21. The device as set forth in claim 12, wherein the barrier layer includes a first barrier layer and a second barrier layer, and wherein the first barrier layer is beneath the upper electrode and the second barrier layer is on the lower electrode.

22. The device as set forth in claim 12, wherein the barrier layer is between about 2 nm and about 30 nm thick.

23. A logic device comprising:
an upper electrode;
a lower electrode;
an organic layer disposed between the upper and lower electrodes, the organic layer having a first side adjacent to the upper electrode and an opposite second side adjacent to the lower electrode, wherein the organic layer has a thickness of about 10 nanometers to about 50 nanometers, wherein the organic layer comprises a non-conductive polymer;
a barrier layer directly on at least one of the first and second sides of the organic layer; and
metal nanoparticles uniformly dispersed in the organic layer, the metal nanoparticles having a diameter of about 10 nm or less, and the metal nanoparticles having an organic material represented by the following formula on a surface of the metal nanoparticles:

$$CH_3(CH_2)_nS-$$

wherein n is an integer from 3 to 10 or 12 to 19.

24. The device as set forth in claim 23, wherein the metal nanoparticle is surface-stabilized with an organic material represented by Formula 1 below:

$$CH_3(CH_2)_nSH \quad \text{Formula 1}$$

wherein n is an integer from 3 to 10 or 12 to 19.

25. The device as set forth in claim 23, wherein the metal nanoparticles are nanoparticles of any metal selected from the group consisting of gold, silver, copper, iron, tungsten, platinum, aluminum, chromium, nickel, zinc, titanium and lead; and wherein the organic layer comprises a non-conductive polymer selected from the group consisting of polymethylmethacrylate, polystyrene, PET and derivatives thereof.

26. The device as set forth in claim 23, wherein the organic layer is about 15 nm thick.

27. The device as set forth in claim 23, wherein each of the upper and lower electrodes is formed of any material selected from the group consisting of metals, metal alloys, metal nitrides, metal oxides, metal sulfides and mixtures thereof.

28. The device as set forth in claim 23, wherein the lower electrode is on a substrate and the upper electrode and the lower electrode are either parallel to or perpendicular to the substrate.

29. The device as set forth in claim 23, wherein the barrier layer includes a first barrier layer and a second barrier layer, and wherein the first barrier layer is beneath the upper electrode and the second barrier layer is on the lower electrode.

30. The logic device as set forth in claim 23, wherein the logic device is selected from the group consisting of mobile communication devices, delayed flip-flop circuits, static binary frequency dividers and analog-to-digital converters.

31. The device as set forth in claim 1, wherein the device has a structure effective to provide a negative differential resistance at voltages greater than about 120V and at voltages less than about −120V.

32. The device as set forth in claim 12, wherein the device has a structure effective to provide a negative differential resistance at voltages greater than about 120V and at voltages less than about −120V.

33. The device as set forth in claim 23, wherein the device has a structure effective to provide a negative differential resistance at voltages greater than about 120V and at voltages less than about −120V.

* * * * *